(12) United States Patent
Herr

(10) Patent No.: US 7,170,960 B2
(45) Date of Patent: Jan. 30, 2007

(54) INSTANTANEOUS CLOCK RECOVERY CIRCUIT

(75) Inventor: Quentin P. Herr, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 830 days.

(21) Appl. No.: 10/324,633

(22) Filed: Dec. 20, 2002

(65) Prior Publication Data

US 2004/0120444 A1 Jun. 24, 2004

(51) Int. Cl.
*H04L 7/00* (2006.01)
(52) U.S. Cl. .................. 375/354; 326/3; 327/367; 331/107 S
(58) Field of Classification Search ................ 375/354; 326/1–5; 327/367; 365/362; 331/107 S, 331/107 T
See application file for complete search history.

(56) References Cited

U.S. PATENT DOCUMENTS

| | | | |
|---|---|---|---|
| 4,181,902 A * | 1/1980 | Scott ...................... | 331/107 S |
| 4,749,888 A * | 6/1988 | Sakai et al. ................. | 326/4 |
| 5,963,351 A | 10/1999 | Kaplounenko et al. | |
| 6,331,805 B1 * | 12/2001 | Gupta et al. ............. | 331/107 S |
| 6,483,339 B1 * | 11/2002 | Durand et al. ............. | 326/5 |
| 6,486,756 B2 * | 11/2002 | Tarutani et al. ........... | 333/99 S |

OTHER PUBLICATIONS

V. Kaplunenko, "Noise consideration in RSFQ circuits," *PHYSICA C*, North Holland Publishing, Amsterdam, NL, vol. 372-376, Aug. 2002, pp. 119-123, XP004375373 ISSN; 0921-4534.
Office Action issued from European Patent Office issued on Nov. 30, 2005 for the corresponding European patent application No. 03 023 895.0-2415.
V. Kaplunenko, V. Borzenets, and N. Dubash, "Superconducting single flux quantum 20 Gb/s clock recovery circuit," *Applied Physics Letters*, Jul. 7, 1997, vol. 71, Issue 1, pp. 128-130.

* cited by examiner

*Primary Examiner*—Khanh Tran
(74) *Attorney, Agent, or Firm*—Posz Law Group, PLC

(57) ABSTRACT

A clock recovery circuit (10) for a superconductor system that enables the phase of a system clock to be instantaneously reset without any pulse interaction. The clock recovery circuit (10) includes a Josephson transmission line oscillator loop (14) of length 2T, where T is equal to one clock period. First and second data inputs (16, 18) are for injecting a data pulse onto the oscillator loop (14). A pulse generator (24) is for injecting an initial clock pulse onto the oscillator loop (14) that is output as periodic clock signals. An output tap (12) is for outputting the data pulse from one of the first and second data inputs (16, 18), and the periodic clock signals in the absence of the data pulse. When the data pulse is input on one of first and second output taps (32, 34), the clock phase is instantaneously reset.

17 Claims, 5 Drawing Sheets

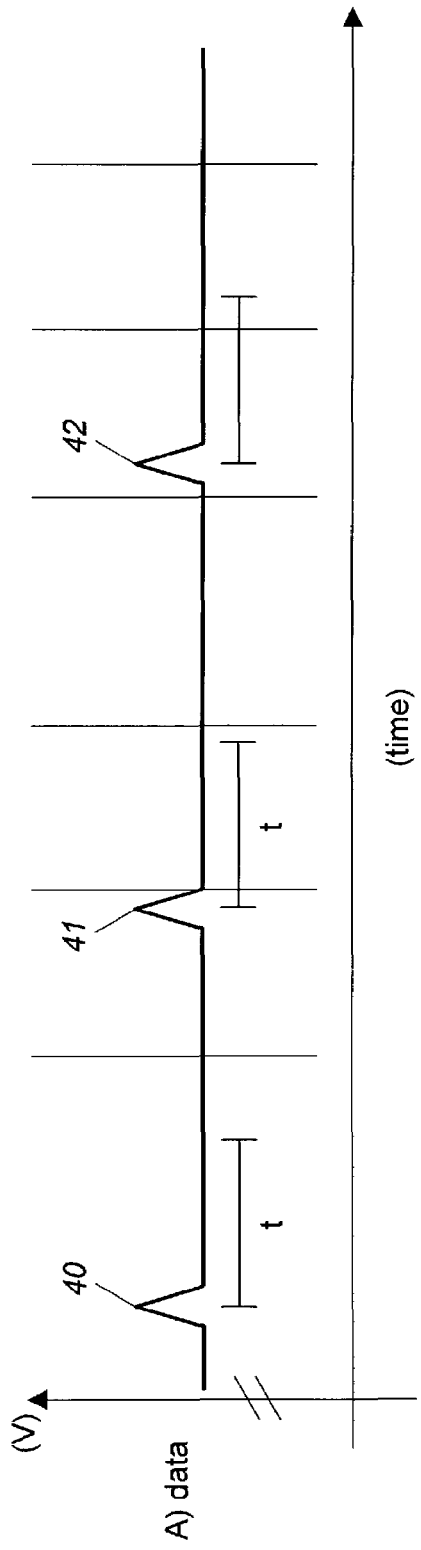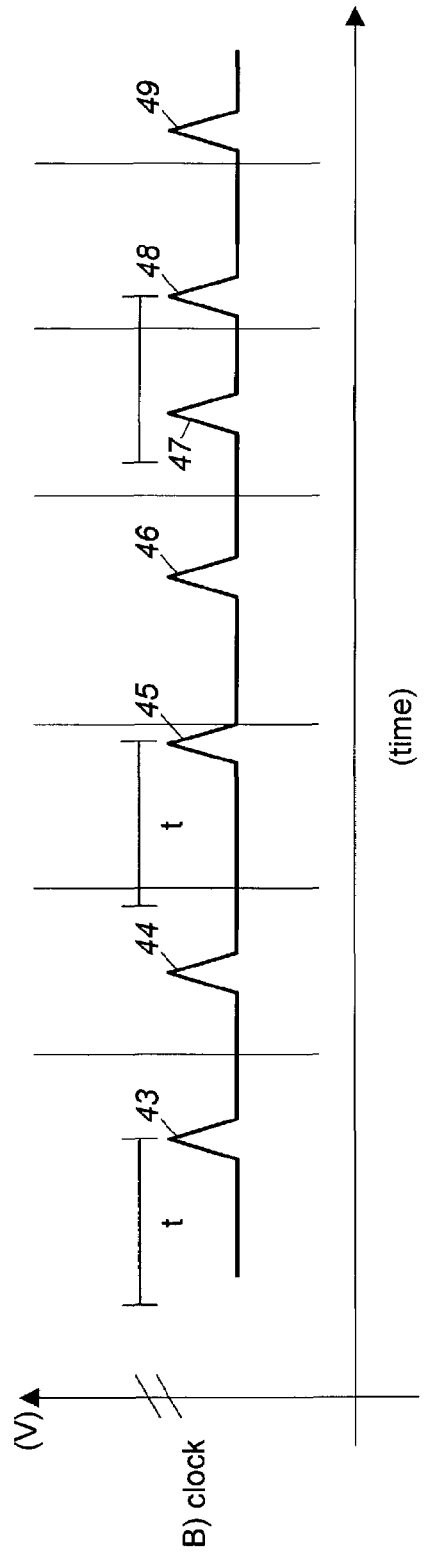

US 7,170,960 B2

INSTANTANEOUS CLOCK RECOVERY CIRCUIT

FIELD OF THE INVENTION

This invention relates generally to superconductor systems and, more particularly, to a clock recovery circuit for a superconductor system data link for instantaneously resetting a system clock phase in response to an input data pulse.

BACKGROUND

Superconductor switches and systems used in, for example, optical data links, would require multiple superconductor chips with high-speed interconnections of 40–150 Gbps per line. At these bit rates, clock recovery is an important design consideration with respect to the data link onto each superconductor chip and with respect to chip-to-chip connections.

In one type of clock recovery circuit used in superconductors, a clock pulse that travels around a ring oscillator formed from a Josephson transmission line (JTL) loop with a single clock-out tap and a single data-in tap including a one-way buffer, generates a clock pulse train that has a period corresponding to the clock period. The circulating clock pulse splits at the clock-out tap to produce the clock output, and to continue to travel around the JTL loop.

The clock pulse that continues to travel around the JTL loop also splits at the data-in tap, but the resulting data pulse that enters the data-in tap escapes in the one-way buffer. A subsequent data pulse entering the oscillator at the data-in tap splits and propagates around the oscillator loop in both directions. The forward-traveling pulse establishes the new clock pulse with new phase, while the back-traveling pulse annihilates the preexisting clock pulse, thereby enabling almost instantaneous clock recovery.

However, the above clock recovery circuit has certain associated limitations. For example, while the clock phase in the above circuit can be advanced, it cannot be retarded when, for example, an input data pulse is late relative to the pre-existing clock pulse. In addition, data input slightly decreases the clock period due to pulse interaction on the oscillator loop. Also, a newly established clock phase may have an associated error due to interaction between the clock and data pulses. Together, these limitations compromise the accuracy of such a circuit.

Therefore, it is an object of the present invention to provide a clock recovery circuit for a superconductor system that is capable of instantaneously resetting the phase of a system clock regardless of the timing of an input data pulse with respect to the system clock.

It is another object of the present invention to provide a clock recovery circuit for a superconductor system designed for inhibiting pulse interaction and therefore for instantaneously resetting the phase of a system clock with minimal associated timing error.

It is another object of the present invention to provide a clock recovery circuit for a superconductor system having simple and flexible design parameters.

SUMMARY OF THE INVENTION

In view of the above, the present invention provides a clock recovery circuit for a superconductor system that enables the phase of a system clock to be instantaneously reset without any pulse interaction. The circuit includes a Josephson transmission line oscillator loop of length 2T, where T is equal to one clock period. First and second data inputs are spaced apart from one another on the oscillator loop by a distance of T for injecting a data pulse onto the oscillator loop.

A pulse generator is for introducing the initial pulse into the oscillator loop. First and second signal taps are spaced apart from one another for receiving the clock pulse from the oscillator loop. An output tap is for outputting the clock pulse from one of the first and second signal taps. When the data pulse is input on one of the first and second data inputs, the clock phase is instantaneously reset.

The clock recovery circuit of the present invention may alternatively include additional data inputs and signal taps for inputting and outputting data and single flux quantum clock pulses as long as the data inputs and signal taps are spaced so that no pulse interaction occurs on the oscillator loop.

BRIEF DESCRIPTION OF THE DRAWINGS

Additional objects and advantages of the present invention will be more readily apparent from the following detailed description of preferred embodiments thereof when taken together with the accompanying drawings in which:

FIGS. 2A and 2B are graphs of exemplary data and clock pulses versus time as output by the clock recovery circuit of FIG. 1;

DESCRIPTION OF THE PREFERRED EMBODIMENTS

Figure 1:
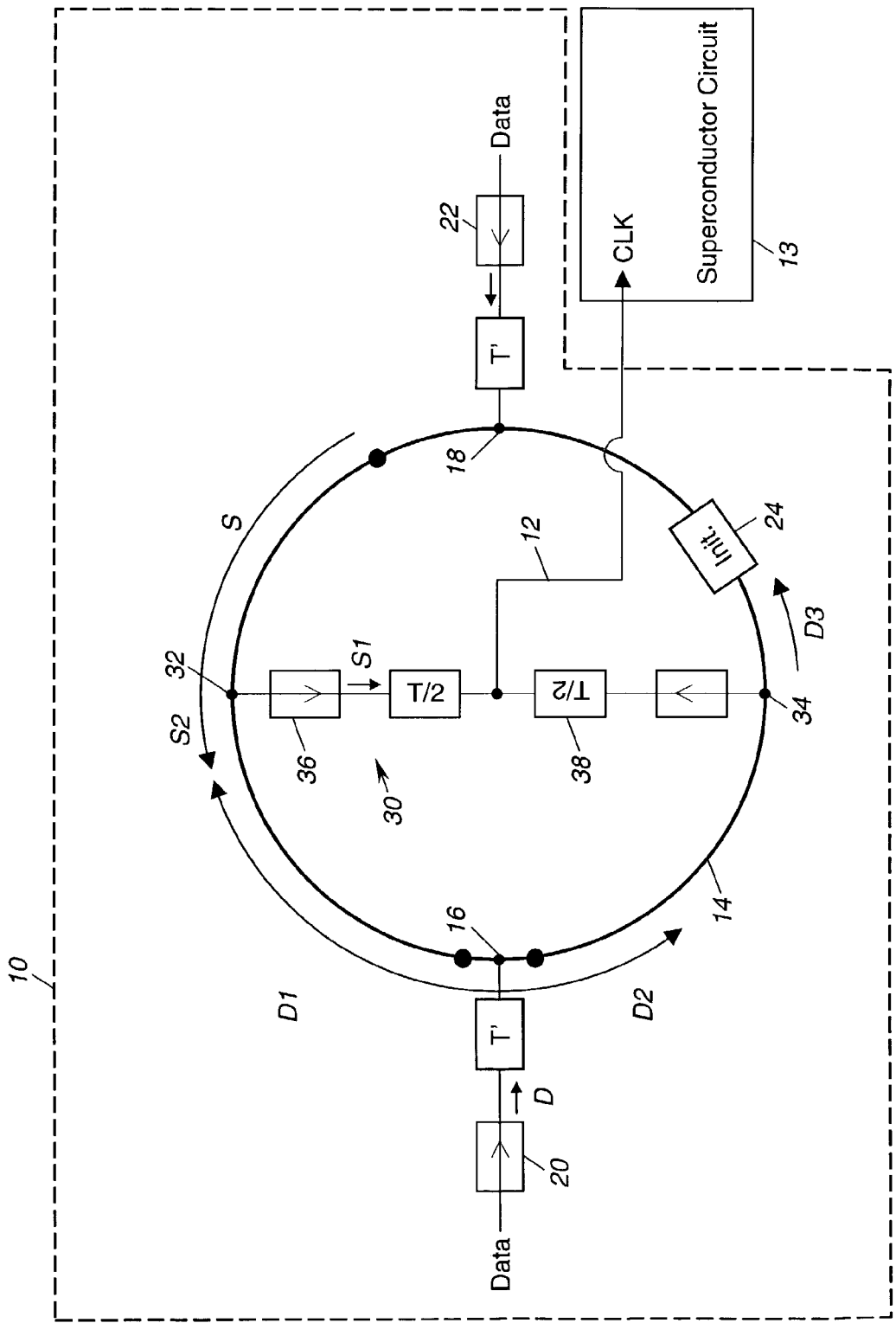
FIG. 1 is a schematic block diagram of an exemplary clock recovery circuit according to a first embodiment of the present invention.

Referring now to the drawings in which like numerals reference like parts, FIG. 1 shows a clock recovery circuit 10 according to a first embodiment of the present invention. The clock recovery circuit 10 is for use in generating a clock signal and resetting the phase of the clock. The clock signal appears at the output tap 12 of the clock recovery circuit 10 in a superconductor digital circuit 13 of the type used in, for example, superconductor switches and related circuitry with high speed interconnect frequencies in the range of approximately 40–150 Gbps. As will be discussed below in detail, the instantaneous clock recovery provided by the clock recovery circuit 10 is crucial, as clock recovery is an integral part of the data link onto the superconductor chip and for inter-chip connections.

The clock recovery circuit 10 includes a Josephson transmission line (JTL) that forms an oscillator loop 14 with a period of 720°, or 2T, where T is a desired clock period. As is well known in the art, the oscillator loop 14 is an active component that provides isolation, power gain and a delay to pulsed signals (single-flux-quantum pulses) transmitted thereon. Because the oscillator loop 14 is an active component, pulses entering the oscillator loop 14 from opposite ends do not pass through one another as in a passive transmission line; rather, the two signals annihilate one another. Single flux quantum pulses are transient voltage pulses that typically have a width on the order of a few picoseconds.

Still referring to FIG. 1, the oscillator loop 14 includes two data inputs 16, 18 that are JTLs spaced apart from one another by 360°, or one clock period T, and that each have an associated delay T', where $0 \leq T' \leq T/2$. The delay T' is large enough to prevent the input data pulse from following the previously circulating clock pulse, referred to as a pre-existing clock pulse, too closely, thereby avoiding pulse interaction. A data pulse is input, or injected, onto the oscillator loop 14 through one of the inputs 16, 18 and subsequently splits. For discussion purposes and ease of understanding, the data pulse D is shown in FIG. 1 as splitting at the input 16 into data pulses D1, D2. Each of the data inputs 16, 18 also includes a one-way buffer 20, 22 for preventing clock pulses, such as the exemplary pulse S generated by an inductively coupled initial pulse generator, such as a single flux quantum (SFQ) generator, 24 from being output on the data inputs 16, 18.

While exemplary data pulses D, D1, D2 and the data input 16 will be referred to throughout the description of the present invention, it should be appreciated that the data pulse D would be injected onto the oscillator loop 14 at the input 18 and simultaneously split into data pulses in a manner that is identical to that described above with respect to the data input 16 if injection of the data pulse at the input 18 would result in the data pulse being located farther from a pre-existing clock pulse on the oscillator loop 14 than if the data pulse was injected at the data input 16. This is so that the data pulse can always reset the clock phase in the loop without interacting with a pre-existing clock pulse. In practice, there is a fair chance that the data pulse will be injected onto the oscillator ring at both data inputs 16, 18. As superfluous pulses are annihilated in the clock recovery circuit 10, the intended operation of the clock recovery circuit 10 is not affected.

The initial pulse generator 24 is of the type well known in the art and is for generating the initial pulse that circulates in the oscillator loop 14 as a clock pulse. As shown in FIG. 1, the initial pulse generator 24 creates and inputs an exemplary circulating clock pulse, such as an SFQ pulse (hereinafter referred to as clock pulse), S onto the oscillator loop 14 that travels along the oscillator loop 14 in the counterclockwise direction. The clock pulse S is subsequently output as periodic clock signals at the clock output tap 12 in the absence of a data pulse from the data inputs 16, 18.

As shown in FIG. 1, the clock output tap 12 is located on another JTL, referred to hereinafter as a clock output JTL, 30 connected to the oscillator loop 14 via first and second output taps 32, 34. The first and second output taps 32, 34 are spaced apart from one another for receiving pulses present in the oscillator loop 14 such as the pulse D2 from the first data input 16, and the preexisting clock pulse S which will reach the output tap and split before being annihilated in the oscillator loop 14. Regarding the above exemplary SFQ pulse S, when the SFQ pulse S splits at the output tap 32 into SFQ pulses S1, S2, the SFQ pulse S1 travels down the clock output JTL 30 and is output at the clock output tap 12, while the SFQ pulse S2 continues to travel on the oscillator loop 14 in a counterclockwise direction. The clock output JTL 30 also includes one-way buffers 36, 38 for preventing data pulses or SFQ pulses from splitting at the clock output tap 12 and being re-injected onto the oscillator loop 14 at one of the first and second output taps 32, 34.

Further, the clock output JTL 30 has an associated time constant of T/2, which is equal to half the clock period. Because the clock output tap 12 is located midway between the first and second output taps 32, 34, the time constant of the clock output JTL 30 ensures that, if two separate pulses each enter the clock output JTL 30 via the respective first and second output taps 32, 34, within a time period of T/2, the second of the two pulses will be annihilated and will therefore not appear at the clock output tap 12.

Still referring to FIG. 1, operation of the clock recovery circuit 10 will now be described. Initially, the pre-existing clock pulse S travels counterclockwise on the oscillator loop 14. It splits into two identical SFQ pulses S1, S2 at the first output tap 32 as described above. The SFQ pulse S1 travels down the clock output JTL 30 and is output at the clock output tap 12 as a clock pulse, while the SFQ pulse S2 continues to travel in a counterclockwise manner on the oscillator loop 14.

In the same span of time that the pulse approaches the output tap 32 and splits and prior to the beginning of a new clock period, the exemplary data pulse D is injected onto the oscillator loop 14 and splits into the two identical data pulses D1, D2 at the data input 16. The data pulse D1 travels in a clockwise manner on the oscillator loop 14 and is annihilated by the SFQ data pulse S2. The data pulse D2 travels in a counterclockwise manner along the oscillator loop 14 and enters the clock output JTL 30 via the output tap 34 and subsequently is output at the clock output tap 12 as a clock pulse. The data pulse also splits at the output tap 34, and a resulting clock pulse D3 continues to travel on the oscillator loop 14 in a counterclockwise direction and becomes the new clock pulse. Because the data inputs 16 or 18 are only active if the pre-existing clock pulse is sufficiently far from the given input, interaction between data pulses that set the new clock phase and preexisting clock pulses is avoided.

FIGS. 2A and 2B graphically show the results of implementation of the clock recovery circuit 10 shown in FIG. 1, with the vertical lines in FIGS. 2A–2B being spaced apart by T. Specifically, in FIG. 2A, data pulses 40, 41, 42 are intermittently injected onto the oscillator loop 14 at either of the data inputs 16, 18 shown in FIG. 1. As shown in FIG. 2B, the phase of the clock pulses 43, 44, 45, 46, 47, 48 and 49 is reset after the input of each of the data pulses. In the absence of a data pulse, clock pulses, such as the SFQ pulses 43, 44, are periodically output and are spaced apart from one another on the oscillator loop 14 (FIG. 1) by T. Thus, each data pulse injected onto the oscillator loop 14 will always reset the phase of the clock that comes out at the tap 12.

When a data pulse is input late with respect to the clock pulses, such as is the case with the data pulse 41 with respect to the SFQ pulse 44, the clock phase is reset. Therefore, the phase of the clock 12 is instantaneously reset as evidenced by a subsequent SFQ pulse 45 that is spaced apart from the data pulse 41 by T and from the SFQ pulse 44 by between T/2 to 3T/2 but depending specifically upon the input timing of the data pulse.

Likewise, when a data pulse is input early with respect to the SFQ pulses, such as is the case with the data pulse 42 with respect to the SFQ pulse 47, the clock phase is reset. Therefore, the phase of the oscillator loop 14 is instantaneously reset, or in other words a subsequent clock pulse occurs exactly one clock period, or T, after the data pulse is output, as is evidenced by a subsequent SFQ pulse 48 that is spaced apart from the data pulse 42 by T and from the SFQ pulse 47 similar to that discussed above in connection with a late input data pulse.

Figure 3A:
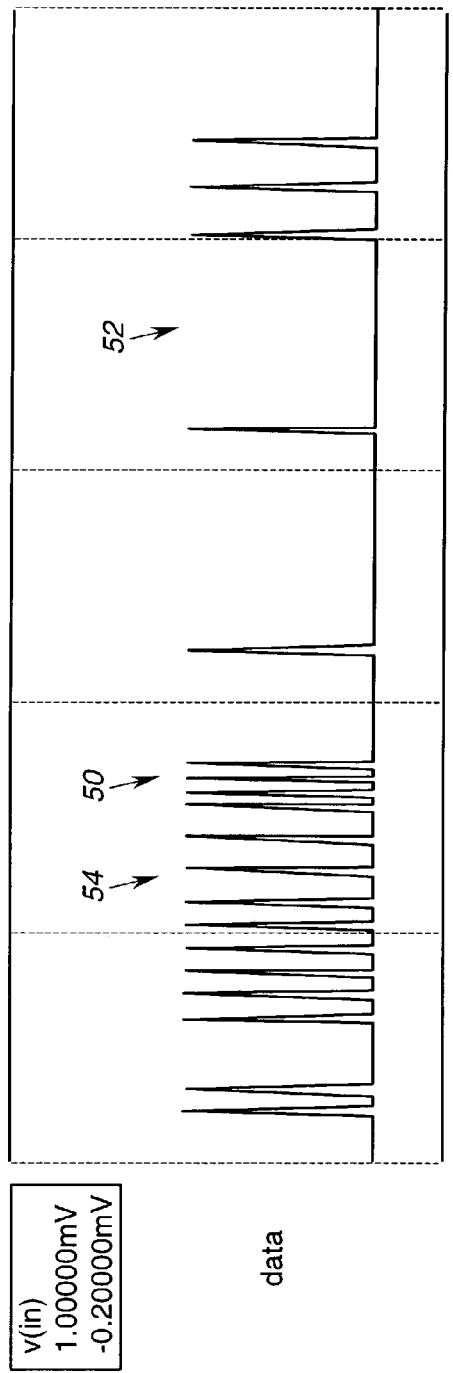
FIGS. 3A and 3B are graphs of simulated results of data pulses and clock pulses output by the clock recovery circuit of FIG. 1.
Figure 3B:
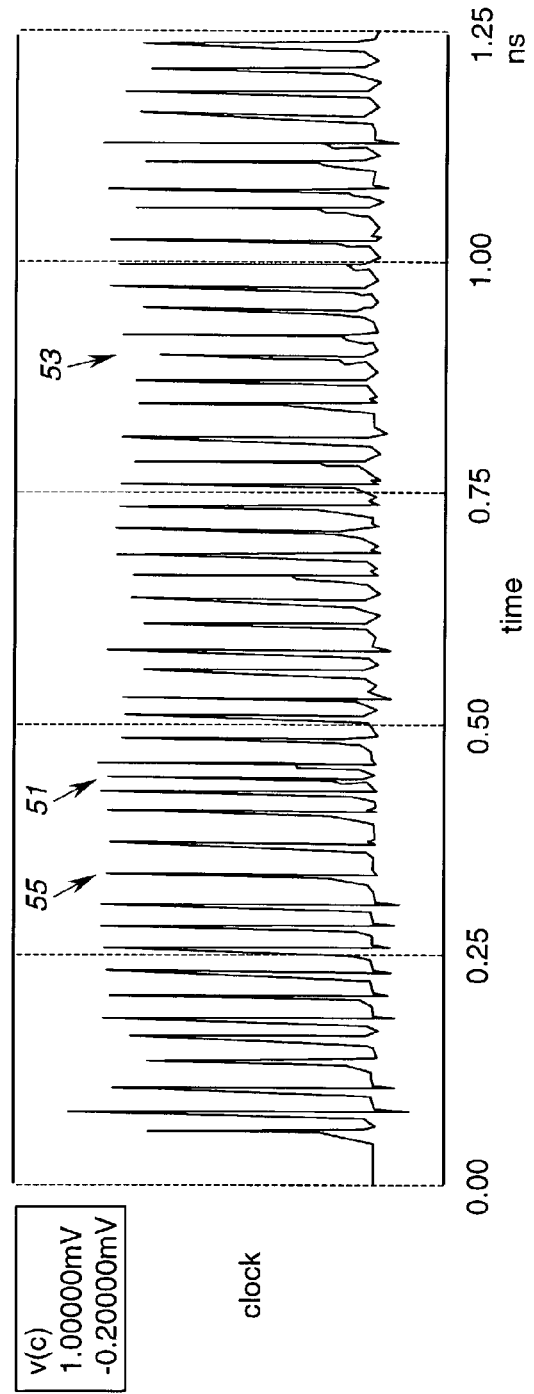

FIGS. 3A–3B show the results of a simulated SPICE analysis of the clock recovery circuit 10 in FIG. 1 when data pulses were injected onto the oscillator loop 14 at varying intervals relative to a clock rate T. As shown, the clock recovery circuit of the present invention enabled a clock phase to be reset on a single data pulse despite data jitter up to ±160°, with the recovered clock phase being ±180° relative to the old clock phase. For example, when data pulses, such as the data pulses at 50, were injected onto the oscillator loop 14 relatively close to one another and spaced apart by less than T, the clock phase was reset upon the occurrence of each data pulse, thereby causing the clock pulses to be generated closely relative to one another, as indicated generally at 51. However, when data pulses, such as the data pulses at 52, were sparse, the clock pulses were injected periodically every T, as indicated generally at 53. Finally, when data pulses, such as the data pulses at 54, were again relatively close to one another but with spacing greater than T and less than 3T/2, the clock phase was again reset upon occurrence of each data pulse, causing clock pulses to be generated with spacing greater than T.

Figure 4:
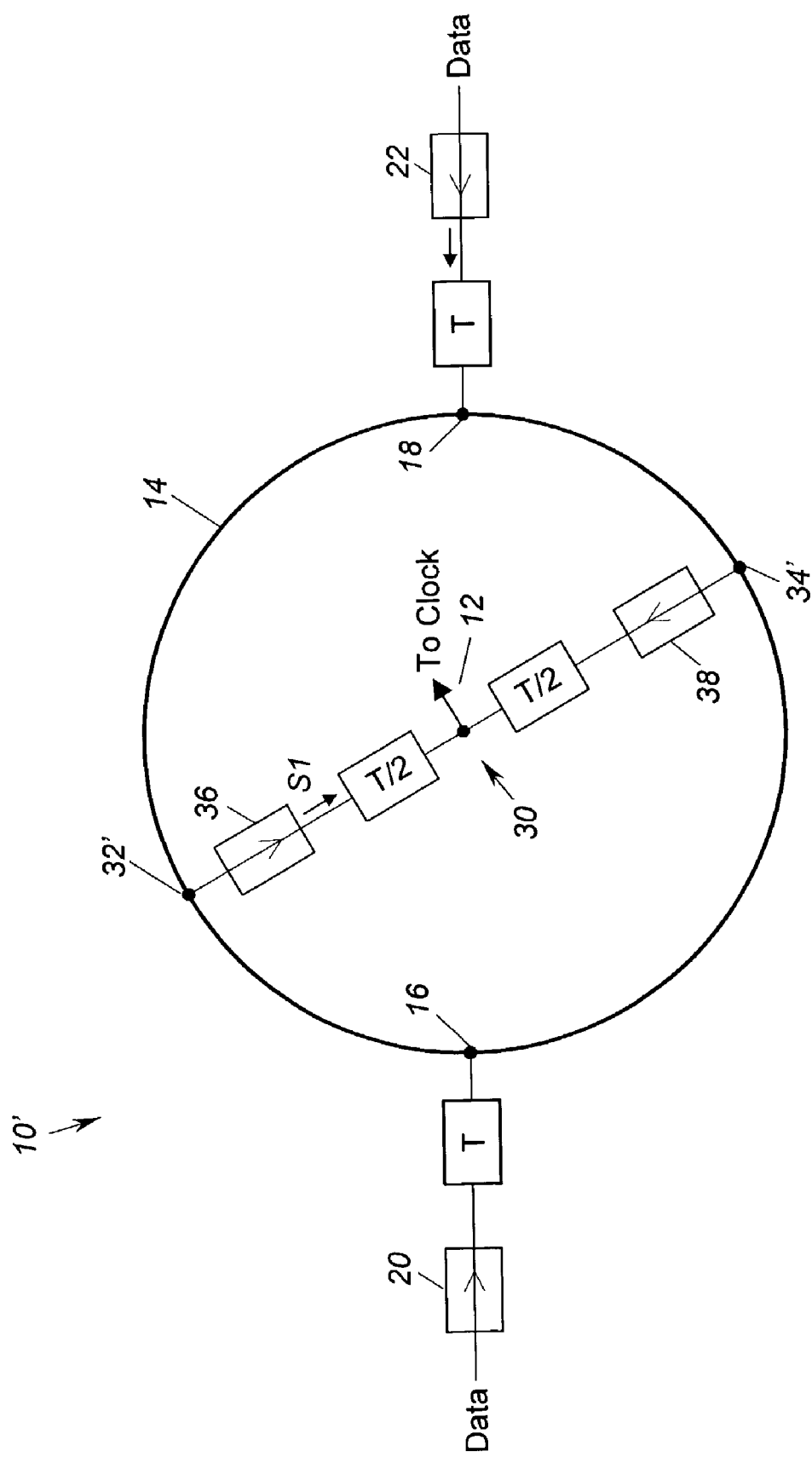
FIG. 4 is a schematic block diagram of an exemplary clock recovery circuit according to a second embodiment of the present invention.

FIG. 4 shows a clock recovery circuit 10' according to a second embodiment of the present invention, with only those elements that differ from corresponding elements in the clock recovery circuit 10 in FIG. 1, and those elements necessary for the description of this embodiment, being shown. The clock recovery circuit 10' has a configuration that is identical to that of the clock recovery circuit 10 of FIG. 1, except that the output taps 32', 34' of the clock output JTL 30' are not spaced from the data inputs 16, 18 by T/2. Rather, the output taps 32', 34' are spaced from the respective data inputs 16, 18 by any distance as long as the data inputs 16, 18 remain spaced from one another by T to ensure that a data pulse can always be injected onto the oscillator loop 14 so that it will instantaneously reset the clock phase without interacting with the pre-existing clock pulse.

Figure 5:
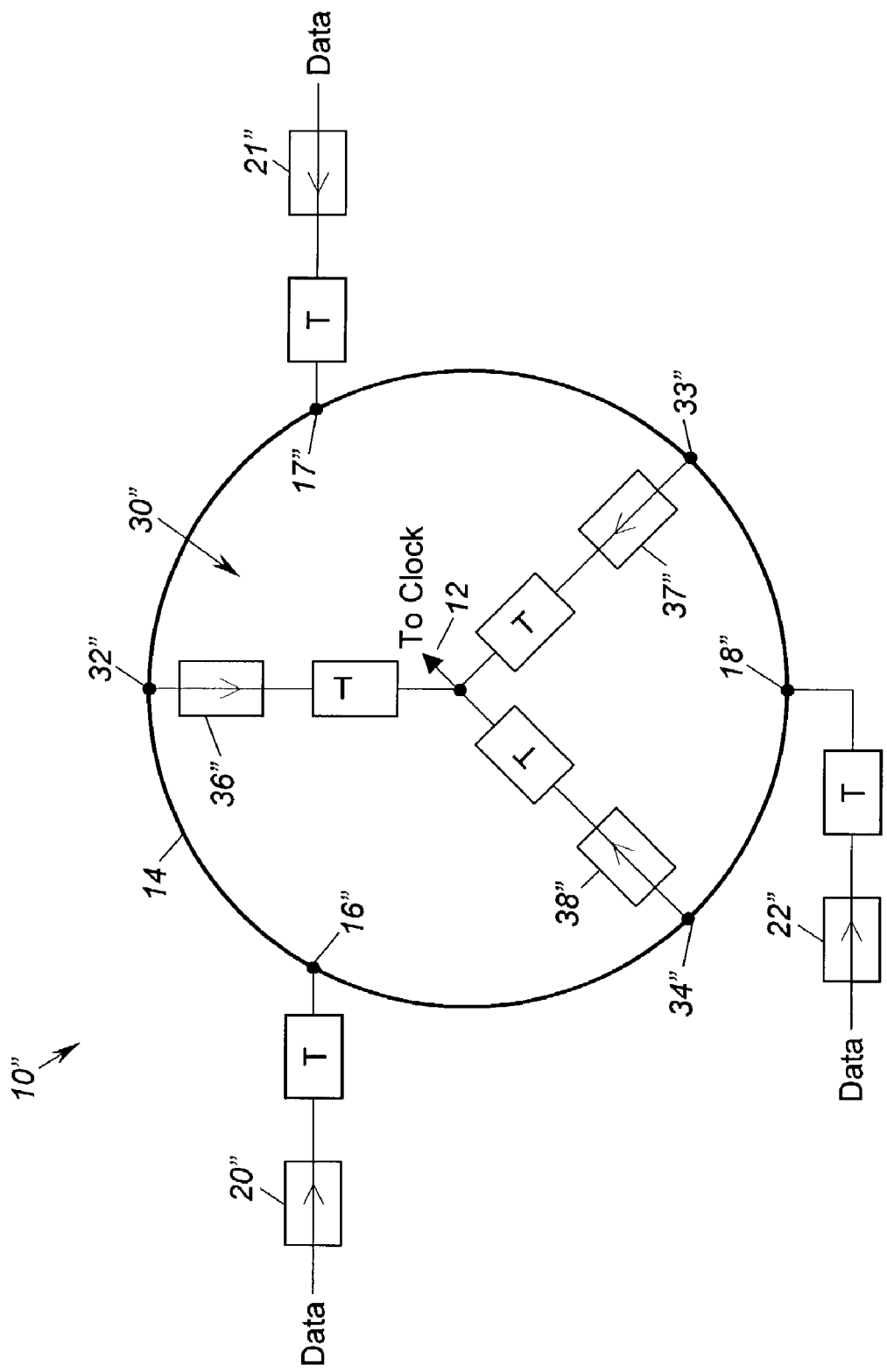
FIG. 5 is a schematic block diagram of an exemplary clock recovery circuit according to a third embodiment of the present invention.

FIG. 5 shows a clock recovery circuit 10" according to a third embodiment of the present invention, with only those elements that differ from corresponding elements in the clock recovery circuit 10 in FIG. 1, and those elements necessary for the description of this embodiment, being shown.

In the clock recovery circuit 10", the clock output JTL 30" includes three output taps 32", 33", 34" with respective one-way buffers 36", 37", 38" and three data inputs 16", 17", 18" with respective one-way buffers 20", 21", 22". Each of the three output taps 32", 33", 34" is equally spaced apart from the other two by T and the three data inputs 16", 17", 18" are also spaced from each other by T. Therefore, a data pulse can always be injected onto the oscillator loop 14 so that, once the data pulse splits at one of the data inputs 16", 17" or 18", one of the split data pulses is output to the clock output tap 12 to instantaneously reset the clock phase without interacting with the pre-existing clock pulse.

As with the clock recovery circuit 10', it should be appreciated that the output taps 32", 33", 34" may be spaced from the respective data inputs 16", 17", 18" by any distance if the data inputs 16", 17", 18" remain spaced apart from one another by T to ensure that a data pulse can always be injected onto the oscillator loop 14 so that, once the data pulse splits at one of the data inputs 16", 17", 18", one of the split data pulses is output to the clock output tap 12 to instantaneously reset the clock phase without interacting with the pre-existing clock pulse.

While the above description is of the preferred embodiment of the present invention, it should be appreciated that the invention may be modified, altered, or varied without deviating from the scope and fair meaning of the following claims.

What is claimed is:

1. A clock recovery circuit, comprising:
    a Josephson transmission line forming an oscillator loop and having a length of 2T, where T is equal to one clock period;
    first and second data inputs spaced apart from one another on the oscillator loop by a distance of T for injecting at least one data pulse onto the oscillator loop;
    a pulse generator for injecting an initial pulse onto the oscillator loop that circulates as a clock pulse and is output as periodic clock signals;
    first and second output taps spaced apart from one another on the oscillator loop for receiving the clock pulse and the data pulse in the oscillator loop; and
    a clock output tap for outputting the clock pulse as the periodic clock signals;
    wherein when the data pulse is input into the oscillator loop, a clock phase is instantaneously reset.

2. The clock recovery circuit of claim 1, wherein the first and second data inputs are spaced apart from one another on the oscillator loop by T, and the first and second output taps are spaced apart from one another on the oscillator loop by T and apart from the first and second data inputs by less than T/2.

3. The clock recovery circuit of claim 1, wherein the first and second data inputs are spaced apart from one another on the oscillator loop by a distance of T and are positioned relative to the first and second output taps to avoid pulse interactions on the oscillator loop.

4. The clock recovery circuit of claim 1, wherein the first and second data inputs are spaced apart from one another to avoid interaction of the data pulse with the clock pulse.

5. A clock recovery circuit. comprising:
    a Josenhson transmission line forming an oscillator loon and havina a length of 2T. where T is equal to one clock period;
    first and second data inputs spaced apart from one another on the oscillator loon by a distance of T for injecting at least one data pulse onto the oscillator loop;
    a pulse generator for injecting an initial pulse onto the oscillator loop that circulates as a clock pulse and is output as periodic clock signals;
    first and second output taps spaced apart from one another on the oscillator loop for receiving the clock pulse and the data pulse in the oscillator loop; and
    a clock output tap for outputting the clock pulse as the periodic clock signals;
    wherein when the data pulse is input into the oscillator loop, a clock phase is instantaneously reset.
    wherein the first and second data inputs are spaced apart from one another on the oscillator loop by T, and the first and second output taps are spaced apart from one another on the oscillator ioop by T and apart from the respective first and second data inputs by T/2.

6. A clock recovery circuit, comprising:
    a Josephson transmission line forming an oscillator loop and having a length of 2T. where T is equal to one clock period;
    first and second data inputs spaced apart from one another on the oscillator loop by a distance of T for injecting at least one data pulse onto the oscillator loop;
    a pulse generator for injecting an initial pulse onto the oscillator loop that circulates as a clock pulse and is output as periodic clock signals:

first and second output taps spaced apart from one another on the oscillator loop for receiving the clock pulse and the data pulse in the oscillator loop; and a clock output tap for outputting the clock pulse as the periodic clock signals;

wherein when the data pulse is input into the oscillator loop, a clock phase is instantaneously reset.

wherein the first and second data inputs are spaced apart from one another on the oscillator loop by a distance of T and are positioned relative to the first and second outnut taps to avoid pulse interactions on the oscillator loop, wherein the instantaneously reset clock phase is ±180° out of phase with a previous clock phase.

7. A clock recovery circuit, comprising:

a Josephson transmission line forming an oscillator loop and having a length of 2T. where T is equal to one clock period;

first and second data inputs spaced apart from one another on the oscillator loop by a distance of T for injecting at least one data pulse onto the oscillator loop;

a pulse generator for injecting an initial pulse onto the oscillator loop that circulates as a clock pulse and is output as periodic clock signals;

first and second output taps spaced apart from one another on the oscillator loop for receiving the clock pulse and the data pulse in the oscillator loop; and a clock output tap for outputting the clock pulse as the periodic clock signals;

wherein when the data pulse is input into the oscillator loop, a clock phase is instantaneously reset, wherein the first and second output taps enable the data pulse to instantaneously reset the clock phase in an advanced or delayed manner based on a timing of the data pulse.

8. A clock recovery circuit, comprising:

a Josephson transmission line forming an oscillator loon and having a length of 2T. where T is equal to one clock period;

first and second data inputs spaced apart from one another on the oscillator loop by a distance of T for injecting at least one data pulse onto the oscillator loop;

a pulse generator for injecting an initial pulse onto the oscillator loop that circulates as a clock pulse and is output as periodic clock signals;

first and second outnut taps spaced apart from one another on the oscillator loop for receiving the clock pulse and the data pulse in the oscillator loop; and a clock output tap for outputting the clock pulse as the periodic clock signals;

wherein when the data pulse is input into the oscillator loop, a clock phase is instantaneously reset, wherein a second of two pulses entering one of the first and second output taps is annihilated if spaced apart from a first of the two pulses by a period of less than T/2.

9. A clock recovery circuit, comprising:

a Josephson transmission line forming an oscillator loop and having a length of 2T, where T is equal to one clock cycle;

at least first, second and third data inputs spaced apart from one another on the oscillator loop by a distance of T for injecting at least one data pulse onto the oscillator loop;

a pulse generator for injecting an initial pulse onto the oscillator loop that circulates as a clock pulse and is output as periodic clock signals; and at least first, second and third output taps spaced apart from one another for receiving the data pulse, and for receiving the clock pulse in absence of the data pulse; and a clock output tap for outputting the clock pulse as the periodic clock signals;

wherein the data pulse is for instantaneously resetting a clock phase when input into the oscillator loop.

10. The clock recovery circuit of claim 9, wherein the at least first, second and third data inputs comprise first, second and third data inputs, and the at least first, second and third output taps comprise first, second and third output taps.

11. The clock recovery circuit of claim 10, wherein the first, second and third data inputs are spaced apart from one another on the oscillator loop by T.

12. The clock recovery circuit of claim 10, wherein the first, second and third data inputs are spaced apart from one another on the oscillator loop by T, and the first, second and third output taps are spaced apart from one another on the oscillator loop by T and apart from the respective first, second and third data inputs by no more than T/2.

13. The clock recovery circuit of claim 9, wherein the at least first, second and third data inputs are spaced apart from one another on the oscillator ioop by T, and the first, second and third output taps are spared apart from one another on the oscillator loop by T and apart from the respective first, second and third data inputs by no more than T/2.

14. The clock recovery circuit of claim 9, wherein the at least first, second and third data inputs are spaced apart from one another on the oscillator loop by T and are positioned relative to the at least first, second and third output taps to avoid pulse interactions on the oscillator loop.

15. The clock recovery circuit of claim 9, wherein the data pulse is for instantaneously resetting the clock phase ±180° out of phase with a previous clock phase when output on the clock output tap.

16. The clock recovery circuit of claim 9, wherein the at least first, second and third data inputs are spaced apart from one another to avoid interaction of the data pulse with the clock pulse.

17. A clock recovery circuit, comprising:

a Josephson transmission line forming an oscillator loop and having a length of 2T, where T is equal to one clock cycle;

output taps spaced apart from one another for receiving circulating clock pulses; and a clock output tap for outputting the clock pulses;

wherein the oscillator loop is for eliminating interaction between the clock pulses and input data pulses thereon, and the data pulses are for instantaneously resetting a clock phase when input into the oscillator loop.

* * * * *